US005440235A

United States Patent [19]

Oko

[11] Patent Number: 5,440,235

[45] Date of Patent: Aug. 8, 1995

[54] SUBMERSIBLE PUMP CABLE TEST METHOD

[75] Inventor: Frederick J. Oko, Seymour, Conn.

[73] Assignee: Hubbell Incorporated, Orange, Conn.

[21] Appl. No.: 205,164

[22] Filed: Mar. 3, 1994

Related U.S. Application Data

[62] Division of Ser. No. 11,800, Feb. 1, 1993, Pat. No. 5,338,213.

[51] Int. Cl.$^6$ ...................... G01R 31/04; H01R 13/44

[52] U.S. Cl. .................................... 324/538; 324/551; 174/138 F; 439/135; 439/149

[58] Field of Search ...................... 324/538, 539, 551; 174/138 F; 439/135, 148, 149, 150

[56] References Cited

U.S. PATENT DOCUMENTS

| | | | |
|---|---|---|---|
| Re. 32,225 | 8/1986 | Neuroth | 174/103 |
| 2,283,117 | 5/1942 | Arutunoff | 103/87 |
| 2,428,323 | 9/1947 | Winer | 439/148 |
| 3,182,280 | 5/1965 | Daut et al. | 439/148 |
| 3,209,061 | 9/1965 | Mier et al. | 174/138 F |
| 4,453,035 | 6/1984 | Neuroth | 174/103 |
| 4,453,036 | 6/1984 | Neuroth | 174/103 |
| 4,454,377 | 6/1984 | Neuroth | 174/103 |
| 4,454,378 | 6/1984 | Neuroth | 174/103 |
| 4,490,577 | 12/1984 | Neuroth | 174/103 |
| 4,532,374 | 7/1984 | Neuroth | 174/103 |
| 4,539,739 | 9/1985 | Himmelberger | 29/564.1 |
| 4,572,926 | 2/1986 | Ganssle | 174/103 |
| 4,609,416 | 9/1986 | Himmelberger et al. | 156/53 |
| 4,644,094 | 2/1987 | Hoffman | 174/47 |
| 4,675,474 | 6/1987 | Neuroth | 174/102 R |
| 4,707,568 | 11/1987 | Hoffman | 174/103 |
| 4,716,260 | 12/1987 | Hoffman | 174/102 R |
| 4,740,658 | 4/1988 | Hoffman | 174/103 |
| 4,743,711 | 5/1988 | Hoffman | 174/109 |
| 4,777,445 | 10/1988 | Kahl | 324/538 |
| 4,791,246 | 12/1988 | Neuroth | 174/102 R |
| 4,986,372 | 1/1991 | Ganssle | 174/106 SC |
| 5,051,103 | 9/1991 | Neuroth | 439/192 |
| 5,136,237 | 8/1992 | Smith et al. | 324/149 |
| 5,338,211 | 8/1994 | Kodama et al. | 439/135 |

*Primary Examiner*—Kenneth A. Wieder
*Assistant Examiner*—Glenn W. Brown
*Attorney, Agent, or Firm*—Jerry M. Presson; Mark S. Bicks

[57] ABSTRACT

A plug for insulating electrical contacts of a male connector has a connector engaging portion for snugly coupling the plug to the connector and a head portion extending from the connector engaging portion. Bores extend axially through the connector engaging portion and only partially through the head portion, and snugly receive the contacts.

6 Claims, 2 Drawing Sheets

SUBMERSIBLE PUMP CABLE TEST METHOD

This is a division of application Ser. No. 08/011,800 filed Feb. 1, 1993, now U.S. Pat. No. 5,338,213.

FIELD OF THE INVENTION

The present invention relates to a plug for insulating contacts of an electrical connector during testing. More particularly, the present invention provides a plug for insulating the contacts extending from a submersible pump pothead. The plug snugly surrounds the contacts thereby preventing flashover when an electrical potential is applied to the pothead cable during testing.

BACKGROUND OF THE INVENTION

Generally, submersible pump potheads are male electrical connectors used in oil wells. After connecting a pothead with submersible pump electrical cable, the cable conductors and the pothead pins or contacts must be electrically tested. The tests may be conducted under laboratory conditions; however, it is often necessary to test the connection at the field site. Various tests are usually conducted, including an insulation resistance test, a DC voltage test to measure microamp leakage and an AC voltage test to measure milliamp leakage.

Some potheads have metallic faces from which the contacts extend. When the conductors and contacts are electrically tested, flashover may occur between the contacts and the pothead face if the contacts are not insulated.

Typically, to insulate the contacts, a silicon test fixture is filled with clean, highly insulating dielectric silicon oil. The pothead is submersed within the filled fixture before electrically testing the connection between the contacts and conduit cable. Although this method works adequately in a laboratory setting, problems arise, such as damage to the pothead cable due to bending, when performing the tests in the field under much more adverse conditions.

Some pothead faces are molded from rubber, thereby eliminating the need to submerse the pothead in the silicon fixture during testing. However, these potheads are limited to a single use. They cannot be reused after being submersed in an oil well, even if submersed for only one day, because of oil swell to the rubber.

SUMMARY OF THE INVENTION

Accordingly, an object of the present invention is to provide an insulating plug that prevents flashover between electrical contacts and the electrical connector.

Another object of the present invention is to provide an insulating plug and electrical assembly that makes it easier to electrically test the submersible pump pothead contacts and the cable conductors in the field.

A further object of the present invention is to provide an insulating plug that eliminates the need to use potheads having rubber faces.

A yet further object of the present invention is to provide an insulating plug and method that prevents a pothead from being damaged during testing.

A yet another object of the present invention is to provide an insulating plug that is inexpensive to manufacture.

The foregoing objects are basically obtained by a plug for insulating electrical contacts of a male connector, comprising a connector engaging portion of electrically insulating material for snugly coupling the plug to the connector; a head portion of electrically insulating material extending from the connector engaging portion; and laterally spaced bores extending axially through the connector engaging portion and partially through the head portion but terminating therein, for receiving electrical contacts therein.

The foregoing objects are also obtained by an electrical assembly for submersible pumps, comprising an electrical connector having contacts extending therefrom and fixedly coupled thereto; a conduit fixedly coupled to the connector and having electrical conductors extending therethrough, the conductors being electrically connected to the contacts; and a plug of electrically insulating material having a connector engaging portion coupling the plug to the connector, a head portion extending from the connector engaging portion and laterally spaced bores extending axially through the connector engaging portion and partially through the head portion but terminating therein, the bores receiving the contacts therein.

The foregoing objects are further obtained by a method of electrically testing a submersible pump cable, comprising the steps of mounting an insulating rubber plug on a pothead connector of the cable with contacts of the pothead received within laterally spaced bores extending axially through a connector engaging portion and only partially through the head portion of the plug; connecting the cable to a test set; and performing electrical tests thereon.

Other objects, advantages, and salient features of the invention will become apparent from the following detailed description which, taken in conjunction with the annexed drawings, discloses a preferred embodiment of the invention.

BRIEF DESCRIPTION OF THE DRAWINGS

Referring to the drawings which form a part of this disclosure.

DETAILED DESCRIPTION OF THE INVENTION

Figure 1:
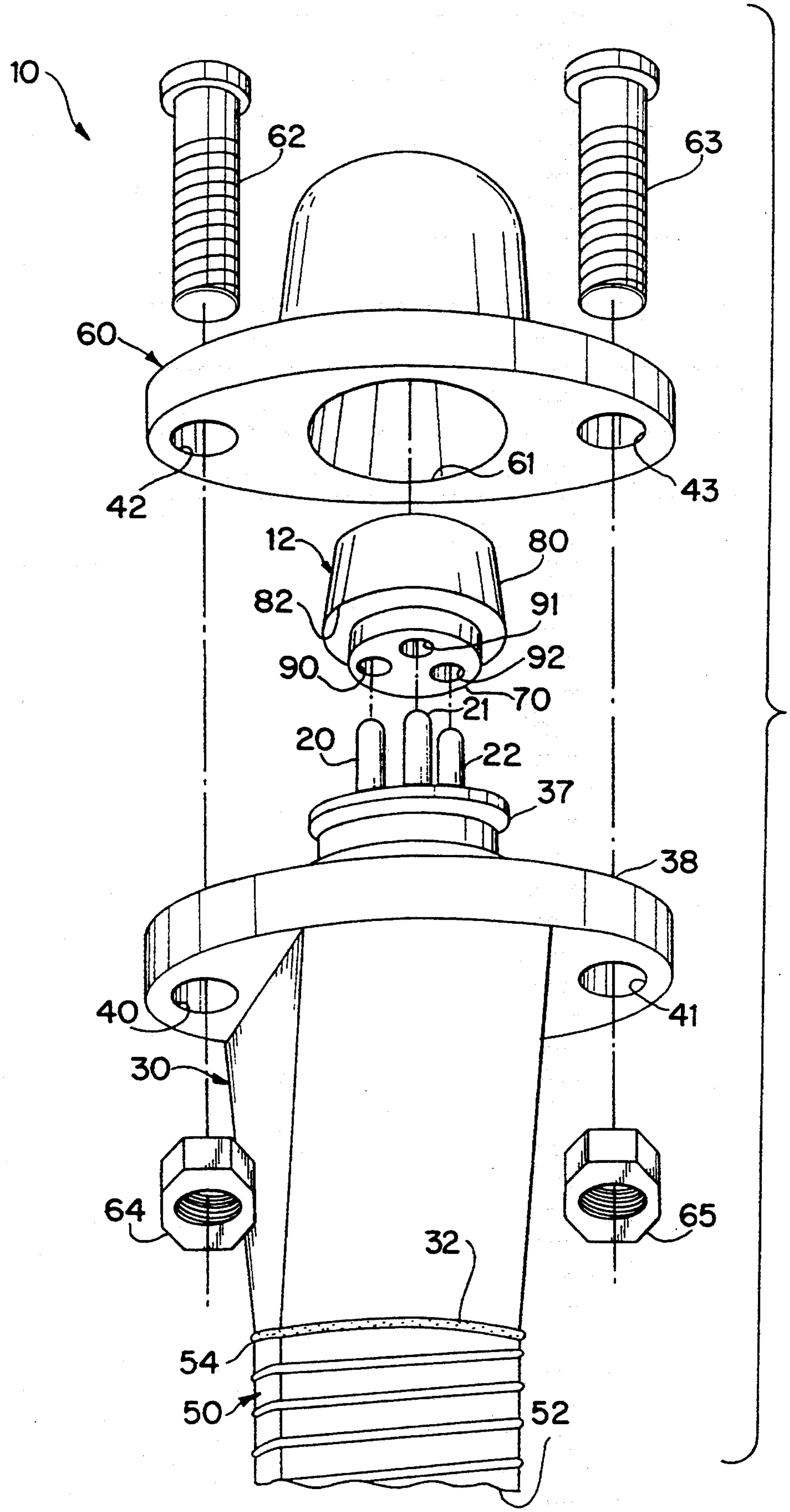
FIG. 1 is a perspective view of an electrical assembly showing a first embodiment of the plug in accordance with the present invention.

Referring initially to FIG. 1, electrical assembly 10 in accordance with a first embodiment of the present invention includes an insulating plug 12. Plug 12 is mounted on and insulates contacts 20–22 of electrical connector 30. An electrical conduit 50, in the form of a flat submersible pump cable, is fixedly coupled to connector 30, and houses a plurality of electrical conductors 46–48 which extend through conduit 50 and are electrically connected to contacts 20–22.

Connector or pothead 30 is conventional, and thus, is only described generally. Potheads are formed of metal and are commonly used in oil wells. The plug of the present invention can be adapted for use with such potheads as the Centrilift 450 and 544 model potheads.

Pothead 30 has a first open end 32 for receiving electrical conduit 50. Conduit 50 extends into a passageway 34 which has a cross-sectional shape corresponding to that of conduit 50.

A hollow neck 37 extends outwardly and perpendicularly from the center of pothead face plate 38. Neck 37 forms a rigid metallic ring or wall around a center portion of the pothead housing contacts 20–22.

Face plate 38 is a metal oval disk and engages protective cap 60. Face plate 38 may be shaped differently; however, it should substantially correspond to the shape of protective cap 60, as seen in FIG. 1.

First and second apertures 40–41 extend through face plate and receive bolts 62–63. As seen in FIG. 1, apertures 40–41 are adjacent opposite ends of the major axis of face plate 38.

Contacts 20–22 are formed of metal and extend perpendicularly and outwardly from face plate 38 axially beyond neck 37. Each contact 20–22 is electrically connected to one conductor 46–48 within passageway 34, is substantially cylindrical and has an enlarged portion at the end extending from the face plate 38. The contacts are supported in electrically insulating material within the pothead connector.

Cable 50, with conductors 46–48 therein and extending therethrough, is inserted into first open end 32 of pothead 30 until conductor 46 is electrically connected to contact 20, conductor 47 is electrically connected to contact 21, and conductor 48 is electrically connected to contact 22. The connected end 54 of cable 50 is then fixedly coupled, preferably by welding, to open end 32 of pothead 30. The cable has a first loose or free end 52 remaining uncoupled for testing purposes.

Conduit or submersible pump cable 50 may take on many shapes and sizes. Typical examples are disclosed in U.S. Pat. Nos. 4,707,568, 4,716,260 and 4,743,711, the subject matter of which are incorporated by reference herein.

The plurality of conductors 46–48 are coupled securely within conduit 50, and are electrically connected to contacts 20–22 within passageway 34 of pothead 30. The number of conductors may vary; however, there must be at least one conductor electrically connected to a contact. If there are a plurality of conductors, each conductor is connected separately to one contact.

Figure 2:
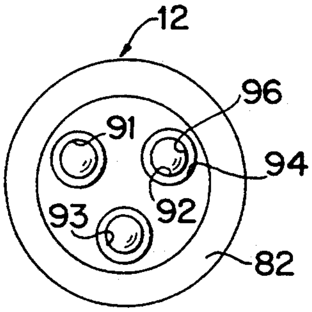
FIG. 2 is a bottom view of the plug of FIG. 1.
Figure 3:
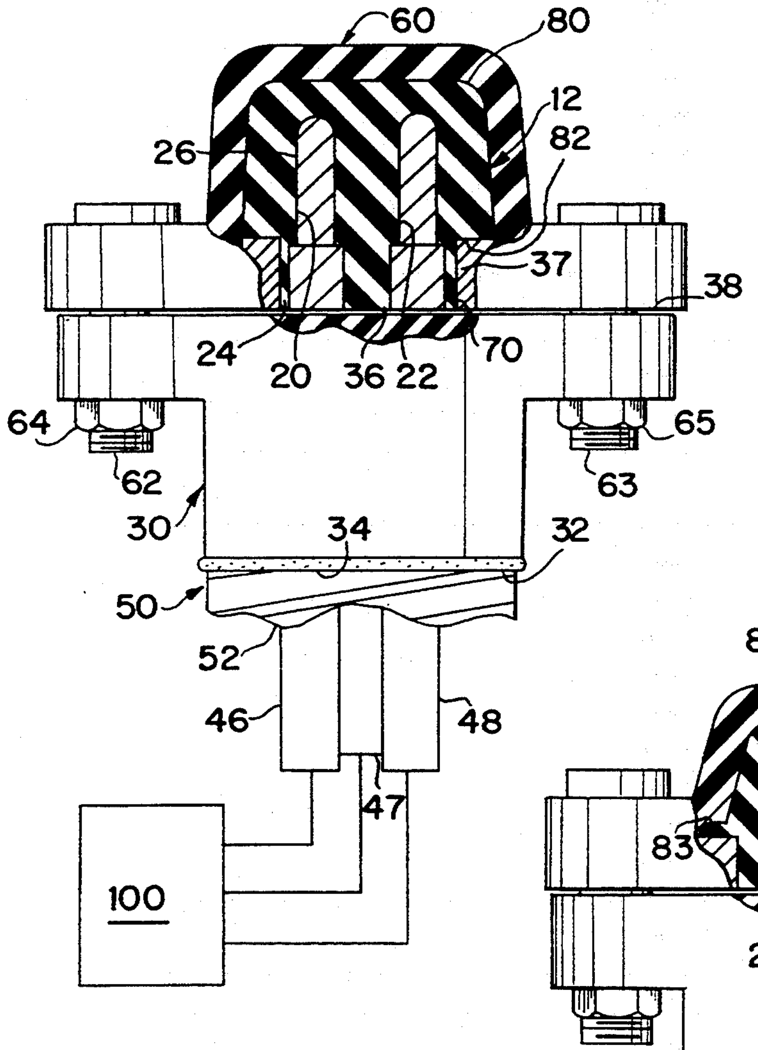
FIG. 3 is a side elevational view in partial section of the electrical assembly in accordance with the present invention having the plug of FIG. 1 and showing the assembly connected to an electrical test set.

Plug 12 is unitarily molded from dielectric insulating rubber, preferably vulcanized S.P. 50. The first embodiment of plug 12, illustrated in FIGS. 1–3, is used with a Centrilift 544 model submersible pump pothead. Plug 12 is inserted over contacts 20–22 to prevent flashover by providing insulation between contacts 20–22 and pothead 30 when electrically testing the pothead cable or conduit 50. Plug 12 also fits within protective shipping cap 60 to protect the contacts from damage and to permit testing without removing the shipping cap.

Plug 12 has a connector engaging portion 70, a head portion 80, and a plurality of blind bores 90–92. Connector engaging portion 70 completely surrounds and insulates electrical contacts 20–22 from connector 30. As seen in FIGS. 1 and 3, connector engaging portion 70 forms a disk-like extension having a circular cross-section extending downwardly from head portion 80. The shape and dimensions of connector engaging portion 70 enable it to fit within neck 37 of connector 30 and snugly surround all of the exposed length of each contact of connector 30.

Head portion 80 extends upwardly from connector engaging portion 70 and provides a substantial thickness of solid insulating rubber relative to connector engaging portion 70. Head portion 80 may take any shape. Preferably, it is shaped and dimensioned to fit within protective shipping cap 60. The head portion 80 is frustoconical with a circular cross-section, the diameter of which is larger than the diameter of connector engaging portion 70. Thus, head portion 80 overhangs connector engaging portion 70.

Head portion 80 has a neck engaging surface 82 immediately adjacent connector engaging portion 70, as seen in FIGS. 1 and 3. When plug 12 is inserted over contacts 20–22, surface 82 engages neck 37 of connector 30.

First, second, and third bores 90–92 extend axially through connector engaging portion 70 and partially through head portion 80, but terminate within the head portion. Bores 90–92 are laterally spaced apart and parallel, preferably in a triangular formation so as to easily receive contacts 20–22. The number and arrangement of bores may vary; however, the number and arrangement should correspond to the number of contacts.

Bores 90–92 snugly surround contacts 20–22, thereby insulating contacts 20–22 from each other and from connector 30. Thus, bores 90–92 are also substantially the same length, diameter and shape as the exposed portions of contacts 90–92.

As seen in FIG. 3, bores 90–92 have a larger diameter portion 94 which extends through connector engaging portion 70, and a smaller diameter portion 96, which extends from larger diameter portion 94 partially through head portion 80.

Figure 4:
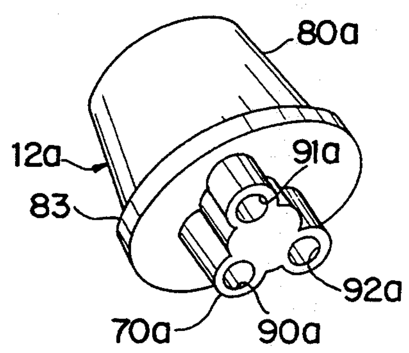
FIG. 4 is a perspective view of a second embodiment of the plug in accordance with the present invention.

The second embodiment of plug 12*a* illustrated in FIGS. 2–4 is used with a Centrilift 450 model pothead.

Connector engaging portion 70*a* is a generally triangular shaped extension extending downwardly from head portion 80*a*, and also snugly couples plug 12*a* to connector 30.

Head portion 80*a* has a collar 83 immediately adjacent and integrally molded to connector engaging portion 70*a*. Collar 83 forms a rubber ring, which is thin relative to the remaining thickness of head portion 80*a*. When plug 12*a* is inserted over contacts 20–22, collar 83 engages neck 37 of connector 30 thereby insulating contacts 20–22 from neck 37.

Thus, surface 82 and collar 83 prevent flashover between contacts 20–22 and neck 37.

Figure 5:
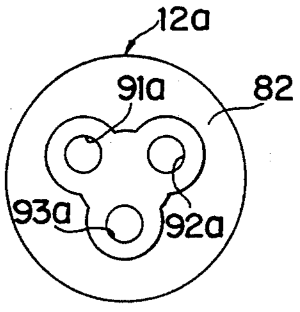
FIG. 5 is a bottom view of the plug of FIG. 4.
Figure 6:
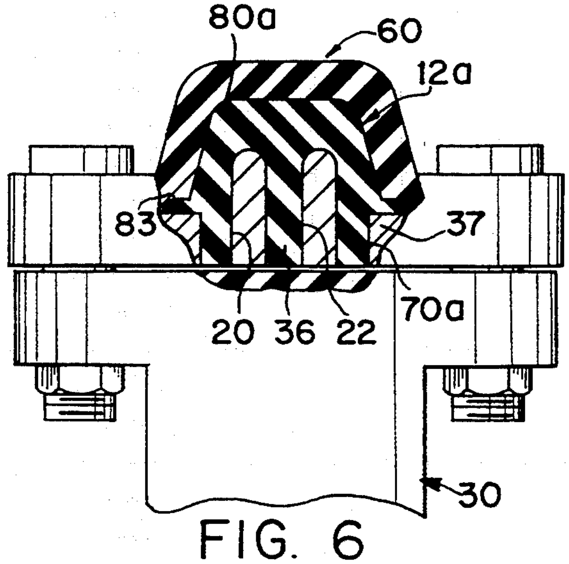
FIG. 6 is a side elevational view in partial section of the electrical assembly in accordance with the present invention having the plug of FIG. 4.

Bores 90*a*–92*a* are consistently one diameter throughout their entire length, as seen in FIGS. 5 and 6.

Contacts 20–22 are inserted within bores 90–92 or 90*a*–92*a*. As seen in FIGS. 1, 3 and 6, connector engaging portion 70 or 70*a* of plug 12 or 12*a* engages metallic face 38, respectively, and fits snugly within neck 37.

As seen in FIG. 3, surface 82 engages and completely covers the top edge of neck 37. As seen in FIG. 6, collar 83 does the same.

With the plug installed, contacts 20–22 are sufficiently insulated from themselves and from the metallic portions of pothead 30, such as face plate 38 and neck 37, to prevent flashover between contacts 20–22 and connector 30 when an electrical potential is applied to conductors 46–48 during testing.

Protective or shipping cap 60, formed from rubber, is placed over plug 12 or 12*a* onto face 38. Protective cap apertures 42 and 43 align with apertures 40 and 41, respectively. Bolt 62 is inserted through apertures 42 and 40, and bolt 63 is inserted through apertures 43 and 41. Nut 64 is then screwed onto bolt 62, and nut 65 is screwed onto bolt 63, to tighten and secure protective shipping cap to pothead 30. Once assembled in such a manner, electrical assembly 10 is ready for shipment to the site and for field testing.

Testing

Various tests may be conducted in testing the contacts 20–22 and conductors 46–48. Typically, an insulation resistance test, DC voltage test, and AC voltage test are performed for each conductor. All tests are phase to ground and phase to phase.

The loose end 52 of cable 50 is stripped back, as in FIG. 3, to expose enough bare conductor for the test leads from test set 100 to attach or clip onto the conductors 46–48.

The insulation resistance test is typically performed with any standard megohmmeter, and 1,000 volts are applied to each conductor individually, for one minute.

The DC voltage test measures microamp leakage and is typically performed using a Hipotronics DC test set. Each conductor is individually subjected to 5 kV of DC for one minute and 25.5 kV of DC for five minutes.

The AC voltage test measures milliamp leakage and is typically performed using a Hipotronics AC test set. Each conductor Is subjected to 5 kV of AC for one minute and 8.5 kV of AC for five minutes, 8.5 kV of AC being approximately the standard field operating level.

Inserting plug 12 or 12*a* over contacts 20–22 ensures that flashover will not occur between contacts 20–22 and pothead 30 while conducting the above tests.

While various embodiments have been chosen to illustrate the invention, it will be understood by those skilled in the art that various changes in modifications can be made therein without departing from the scope of the invention as defined in the appended claims.

What is claimed is:

1. A method of electrically testing a submersible pump cable, comprising the steps of:

mounting an insulating resilient plug on a pothead connector of the cable having a neck and contacts extending from an end face of the connector such that the contacts of the connector are received within laterally spaced bores extending axially through a connector engaging portion and only partially through a head portion of the plug, that the connector engaging portion snugly couples and seals the plug within the neck, and that the bores snugly couple and seal the contacts to prevent flashover between each contact and other conductive parts of the connector;

connecting the cable to a test set; and performing electrical tests on the cable.

2. A method according to claim 1 wherein a rigid protective cap is coupled to the pothead connector with the plug received within and completely surrounded by the cap.

3. A method according to claim 1 wherein the contacts of the pothead connector are snugly received and sealed within the plug bores along the entire length of each of the contacts.

4. A method of electrically testing a cable, comprising the steps of:

mounting an insulating resilient plug on a connector on one end of the cable with the connector having a neck and contacts extending from an end face of the connector such that the contacts of the connector are received within laterally spaced bores extending axially through a connector engaging portion and only partially through a head portion of the plug, that the connector engaging portion snugly couples and seals the plug within the neck and that the bores snugly couple and seal the contacts to prevent flashover between each contact and other conductive parts of the connector;

connecting the cable to a test set; and performing electrical tests on the cable.

5. A method according to claim 4 wherein a rigid protective cap is coupled to the connector with the plug received within and completely surrounded by the cap.

6. A method according to claim 4 wherein the contacts of the connector are snugly received and sealed within the plug bores along the entire length of each of the contacts.

* * * * *